(12) United States Patent
Kawahara et al.

(10) Patent No.: US 11,808,801 B2
(45) Date of Patent: Nov. 7, 2023

(54) SEMICONDUCTOR DEVICE RELIABILITY EVALUATION APPARATUS AND SEMICONDUCTOR DEVICE RELIABILITY EVALUATION METHOD

(71) Applicant: Mitsubishi Electric Corporation, Tokyo (JP)

(72) Inventors: Chihiro Kawahara, Tokyo (JP); Yukihiko Wada, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 331 days.

(21) Appl. No.: 17/047,393

(22) PCT Filed: Apr. 19, 2019

(86) PCT No.: PCT/JP2019/016774
§ 371 (c)(1),
(2) Date: Oct. 14, 2020

(87) PCT Pub. No.: WO2019/244465
PCT Pub. Date: Dec. 26, 2019

(65) Prior Publication Data
US 2021/0116493 A1 Apr. 22, 2021

(30) Foreign Application Priority Data
Jun. 21, 2018 (JP) ................................. 2018-117700

(51) Int. Cl.
*G01R 31/26* (2020.01)
*G01N 17/00* (2006.01)
(Continued)

(52) U.S. Cl.
CPC ............. *G01R 31/26* (2013.01); *G01N 17/00* (2013.01); *G01R 31/3008* (2013.01); *G01R 31/317* (2013.01)

(58) Field of Classification Search
None
See application file for complete search history.

(56) References Cited

U.S. PATENT DOCUMENTS 5,457,322 A * 10/1995 Kitaguchi ............. H01L 31/115
250/370.06
9,000,791 B2 * 4/2015 Driesen .............. G01R 31/2621
327/309
(Continued)

FOREIGN PATENT DOCUMENTS

CN 101540249 A * 9/2009
JP S58-4082 U 1/1983
(Continued)

OTHER PUBLICATIONS

Office Action dated Dec. 14, 2021 in Japanese Patent Application No. 2021-006003, 11 pages.
(Continued)

*Primary Examiner* — Jermele M Hollington
(74) *Attorney, Agent, or Firm* — XSENSUS LLP

(57) ABSTRACT

A direct-current power supply applies a DC voltage to test semiconductor devices. A current detection unit detects a leakage current of a test circuit in which test semiconductor devices are included. A measuring instrument records a pulse waveform of the leakage current. An analyzer analyzes reliability of test semiconductor devices included in the test circuit based on the recorded pulse waveform.

14 Claims, 12 Drawing Sheets

(51) Int. Cl.
*G01R 31/30* (2006.01)
*G01R 31/317* (2006.01)

(56) References Cited

U.S. PATENT DOCUMENTS

| | | | | |
|---|---|---|---|---|
| 11,222,151 B2 * | 1/2022 | Uryu | ........................ | G06F 30/20 |
| 2012/0181615 A1 | 7/2012 | Shimizu et al. | | |

FOREIGN PATENT DOCUMENTS

| | | | |
|---|---|---|---|
| JP | 7-66260 A | 3/1995 | |
| JP | H08-213384 A | 8/1996 | |
| JP | H08-227936 A | 9/1996 | |
| JP | 2000-228255 A | 8/2000 | |
| JP | 2002-98733 A | 4/2002 | |
| JP | 2002-323546 A | 11/2002 | |
| JP | 2007-292675 A | 11/2007 | |
| JP | 4935789 B2 | 5/2012 | |
| JP | 2012-151160 A | 8/2012 | |
| JP | 2017-009331 A | 1/2017 | |
| JP | 2017-102002 A | 6/2017 | |
| WO | WO-2018101053 A1 * | 6/2018 | ............. G01R 15/18 |

OTHER PUBLICATIONS

International Search Report and Written Opinion dated Jun. 18, 2019 for PCT/JP2019/016774 filed on Apr. 19, 2019, 10 pages including English Translation of the International Search Report.
Notification of Reasons for Refusal received for Japanese Patent Application No. 2020-525305, dated Sep. 8, 2020, 11 pages including English Translation.
Office Action dated Dec. 8, 2020 in Japanese Patent Application No. 2020-525305, 6 pages.
Chinese Office Action dated Mar. 28, 2023 in corresponding Chinese Patent Application No. 201980039608.6 (with machine-generated English translation), 30 pages.

* cited by examiner

SEMICONDUCTOR DEVICE RELIABILITY EVALUATION APPARATUS AND SEMICONDUCTOR DEVICE RELIABILITY EVALUATION METHOD

CROSS-REFERENCE TO RELATED APPLICATIONS

The present application is based on PCT filing PCT/JP2019/016774, filed Apr. 19, 2019, which claims priority to JP 2018-117700, filed Jun. 21, 2018, the entire contents of each are incorporated herein by reference.

TECHNICAL FIELD

The present disclosure relates to a semiconductor device reliability evaluation apparatus and a semiconductor device reliability evaluation method.

BACKGROUND ART

Semiconductor devices, such as power MOSFETs (Metal-Oxide-Semiconductor-Field-Effect Transistor) or IGBTs (Insulated Gate Bipolar Transistor), can perform power conversion operation, such as inverter operation. In the inverter operation, the semiconductor device generates an alternating-current (AC) voltage from a direct-current (DC) voltage through a switching operation, while maintaining a high DC voltage for a long period of time. In nature, in contrast, cosmic ray-derived radiation, such as electromagnetic waves or corpuscular rays, is constantly traveling around. If a semiconductor device receives cosmic ray-derived radiation while retaining a high voltage, the semiconductor device may be destroyed. Such a destructive phenomenon is called single event burnout (SEB).

Resistance to SEB is called LTDS (Long Term DC bias Stability). In order to fabricate a semiconductor device that has high LTDS, LTDS of the semiconductor device needs to be measured. SEB occurs only with very low probabilities. Thus, the method of measurement of LTDS of the semiconductor device in nature requires a long-term observation, taking several hundred hours to several thousand hours or longer.

An accelerated test is known which can evaluate the reliability of the semiconductor device in a reduced time, avoiding such a lengthy test. In the accelerated test, artificial radiation, which is far stronger than radiations in nature, is emitted to the semiconductor device. Based on the probability of destruction of the semiconductor device in the accelerated test, the probability of destruction of the semiconductor device in nature is estimated (e.g., see PTL 1).

CITATION LIST

Patent Literature

PTL 1: Japanese Patent No. 4935789

SUMMARY OF INVENTION

Technical Problem

The accelerated test disclosed in PTL 1 requires a radiation producing apparatus which generates powerful artificial radiation, and a protection mechanism for protecting an operator from powerful artificial radiation.

Therefore, an object of the present disclosure is to provide a semiconductor device reliability evaluation apparatus and a semiconductor device reliability evaluation method that allow the reliability of a semiconductor device to be evaluated in a short time, without emitting artificial radiation to the semiconductor device.

Solution to Problem

In order to solve the above problem, a semiconductor device reliability evaluation apparatus according to the present disclosure includes: a direct-current (DC) power supply to apply a DC voltage to at least one test semiconductor device; a current detection unit to detect a leakage current of a test circuit in which the at least one test semiconductor device is included; a measuring instrument to record a pulse waveform of the leakage current; and an analyzer to analyze reliability of the at least one test semiconductor device included in the test circuit, based on the recorded pulse waveform.

Advantageous Effects of Invention

According to the present disclosure, the reliability of a semiconductor device can be evaluated in a short time, without emitting artificial radiation to the semiconductor device.

DESCRIPTION OF EMBODIMENTS

Hereafter, embodiments according to the present disclosure will be described, with reference to the accompanying drawings.

Embodiment 1

Figure 1:
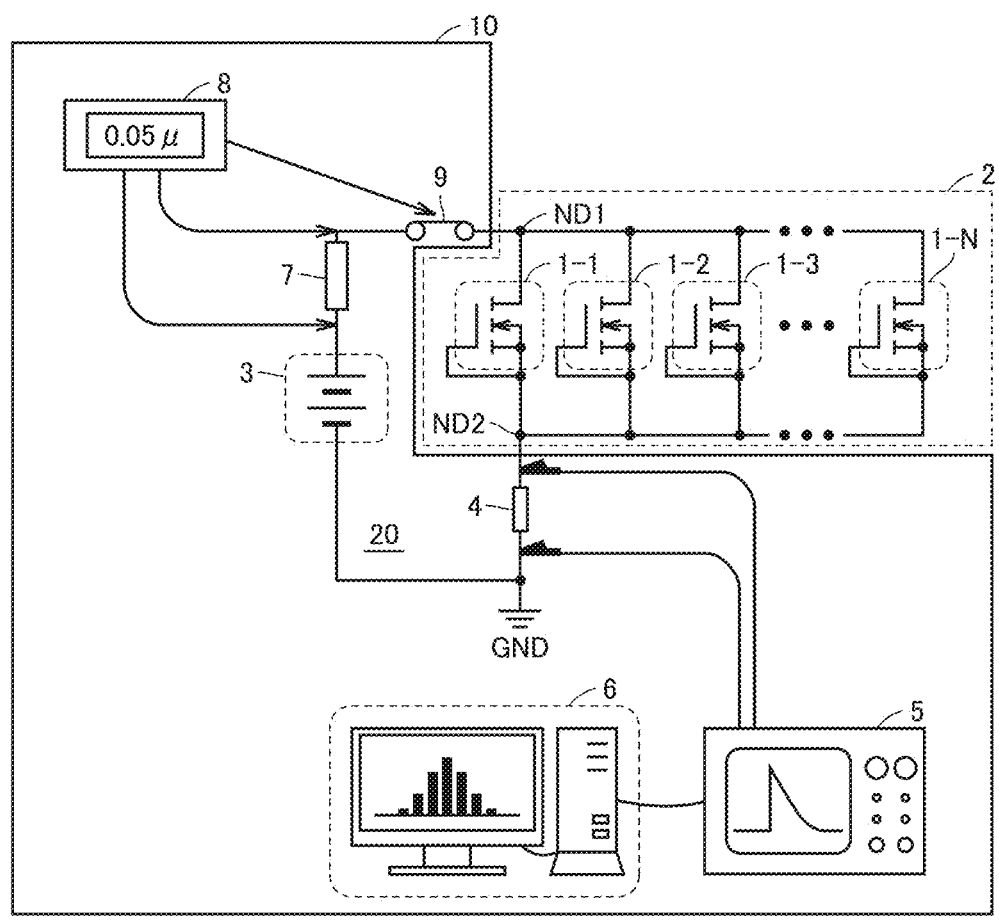
FIG. 1 is a block diagram of a semiconductor device reliability evaluation apparatus according to Embodiment 1.

FIG. 1 is a block diagram of a semiconductor device reliability evaluation apparatus according to Embodiment 1.

Test semiconductor devices 1-1 through 1-N are MOSFETs or IGBTs, for example. Semiconductor devices 1-1 through 1-N are not limited to self turn-off devices, and may be PiN diodes, or rectifying elements, such as a Schottky diode. The material of the semiconductor device is not limited to a general Si, and may be SiC, GaN, Ga2O3, or diamond, which has a large bandgap.

FIG. 1 shows N self turn-off semiconductor devices 1-1 through 1-N. Semiconductor device 1-1 refers to the first test semiconductor device, and semiconductor device 1-N refers to the N-th test semiconductor device. Semiconductor devices 1-1 through 1-N are connected in parallel, thereby forming a test circuit 2. The same voltage is applied to semiconductor devices 1-1 through 1-N. A reliability evaluation apparatus 10 according to the present embodiment evaluates the reliability of N semiconductor devices 1-1 through 1-N included in test circuit 2.

Semiconductor devices 1-1 through 1-N each have the drain terminal or the collector terminal connected to a node ND1. Semiconductor devices 1-1 through 1-N each have the source terminal or the emitter terminal connected to a node ND2. In order to prevent breakthrough of the self turn-off devices, the gate terminals or the base terminals of semiconductor devices 1-1 through 1-N are shorted to the source terminals or the emitter terminals of semiconductor devices 1-1 through 1-N.

Reliability evaluation apparatus 10 includes a DC power supply 3, a current detection unit 4, a voltmeter 8, a protection resistor 7, a switch 9, measuring instrument 5, and an analyzer 6.

DC power supply 3, protection resistor 7, switch 9, test circuit 2, and voltmeter 8 form a closed circuit 20. DC power supply 3 has one end connected to one end of protection resistor 7. DC power supply 3 has the other end connected to a ground GND. Protection resistor 7 has the other end connected to one end of switch 9. Switch 9 has the other end connected to node ND1. Test circuit 2 connects node ND1 and node ND2. Current detection unit 4 has one end connected to node ND2. Current detection unit 4 has the other end connected to ground GND.

The voltage of DC power supply 3 is set to any value that is 50% or above the rated voltage of semiconductor devices 1-1 through 1-N, which are test semiconductor devices.

Voltmeter 8 uninterruptedly measures a voltage across protection resistor 7, thereby measuring a current that flows through closed circuit 20.

Switch 9 is configured of a relay, for example. If, as a result of incident of radiation having a higher energy than normal on semiconductor devices 1-1 through 1-N, at least one or more of semiconductor devices 1-1 through 1-N are destroyed and the current flows through test circuit 2 uninterruptedly, the current flow through closed circuit 20, measured by voltmeter 8, will be greater than or equal to a threshold continuously. In such a case, closed circuit 20 can be prevented from being destroyed or burn out by turning off the switch 9. Protection resistor 7 is selected which has a sufficient capacity preventing closed circuit 20 from being burn out even if a current uninterruptedly flows therethrough, for example, a few kilo ohms, a few watts protection resistor.

When radiation is incident on any of semiconductor devices 1-1 through 1-N, an electric charge is generated within the semiconductor device (e.g., 1-$i$) on which the radiation is incident. As a result, the resistance of semiconductor device 1-$i$ decreases. This causes an electric charge Q to be supplied to semiconductor device 1-$i$ from the remaining (N−1) semiconductor devices connected in parallel. Electric charge Q within semiconductor device 1-$i$ and electric charges that flow from (N−1) semiconductor devices, represented by (N−1)×Q, are stored in semiconductor device 1-$i$. Accordingly, the electric charge, represented by N×Q, is stored in semiconductor device 1-$i$. Electric charge Q can be calculated by a product of an output capacity Coss of each semiconductor device and a voltage Vds applied to the semiconductor device. As the electric charge N×Q within semiconductor device 1-$i$ increases greater than or equal to a threshold electric charge Qth, which is required to destroy semiconductor device 1-$i$, semiconductor device 1-$i$ is destroyed. Accordingly, in order to prevent semiconductor device 1-$i$ from being destroyed, N, Coss, and Vds are set so that N×Coss×Vds is less than Qth. As Qth, a value can be used which is registered in a database for a reference semiconductor device for a device whose failure rate is known. Alternatively, the value of Qth may be estimated, using device simulation.

Current detection unit 4 (aka, current detection circuit) measures the voltage between node ND2 and ground GND, thereby detecting the current flow through test circuit 2. Current detection unit 4 measures the sum of leakage currents of semiconductor devices 1-1 through 1-N while an off-voltage is being applied to the gate terminals or the base terminals of semiconductor devices 1-1 through 1-N. Current detection unit 4 is configured of a current probe or a resistor.

Measuring instrument 5 constantly monitors the voltage measured by current detection unit 4. Measuring instrument 5 is configured of an oscilloscope or the like. Measuring instrument 5 records changes in the leakage current, measured by current detection unit 4, over time until after a period of time from a moment the value of the leakage current measured by current detection unit 4 is greater than or equal to a threshold It. If radiation is incident on none of the semiconductor devices, the magnitude of the leakage current is less than or equal to threshold It. Accordingly, measuring instrument 5 does not record leakage current. As radiation is incident on any of the semiconductor devices, an instantaneous, leakage current having pulse forms is generated. Measuring instrument 5 starts recording a pulse at a moment the magnitude of the pulses is greater than or equal to threshold It.

Analyzer 6 is connected to measuring instrument 5. As measuring instrument 5 starts recording a pulse waveform, analyzer 6 receives and accumulates the pulse waveform from measuring instrument 5 through a communication line. After the pulse waveform is captured into analyzer 6, measuring instrument 5 waits for the subsequent pulse. Analyzer 6 analyzes the pulse waveform from measuring instrument 5, and saves an analysis result.

In Embodiment 1, analyzer 6 analyzes an analysis item A. Analysis item A is the magnitude of pulse. The magnitude of pulse means the height of pulse or the amplitude of pulse. The magnitude of pulse can be, for example, a difference between the magnitude of a normal leakage current and a peak of a leakage current having pulse forms.

Analyzer 6 compares a database of the test semiconductor devices with the database of the reference semiconductor device. Based on the database of test semiconductor devices 1-1 through 1-N and the database of the reference semiconductor device, analyzer 6 estimates LTDS of the overall test semiconductor devices 1-1 through 1-N. Here, LTDS is the reciprocal of failure probability. For the failure probability, for example, FIT (Failure In Time) or the like is employed. The database of the reference semiconductor device is previously created, or created through another measurement that is performed simultaneously with the database of the test semiconductor devices. The database of the reference semiconductor device includes collection of multiple data items related to analysis items A, B, C with respect to a reference semiconductor device whose LTDS is known. Analysis items B, C will be described below. Since LTDS of the reference semiconductor device is known, LTDS of test semiconductor devices 1-1 through 1-N can be estimated as values relative to LTDS of the reference semiconductor device.

Thus, LTDS of the overall semiconductor devices 1-1 through 1-N is estimated, without having to wait until semiconductor devices 1-1 through 1-N are destroyed.

Next, details of the analysis is described.

Figure 2:
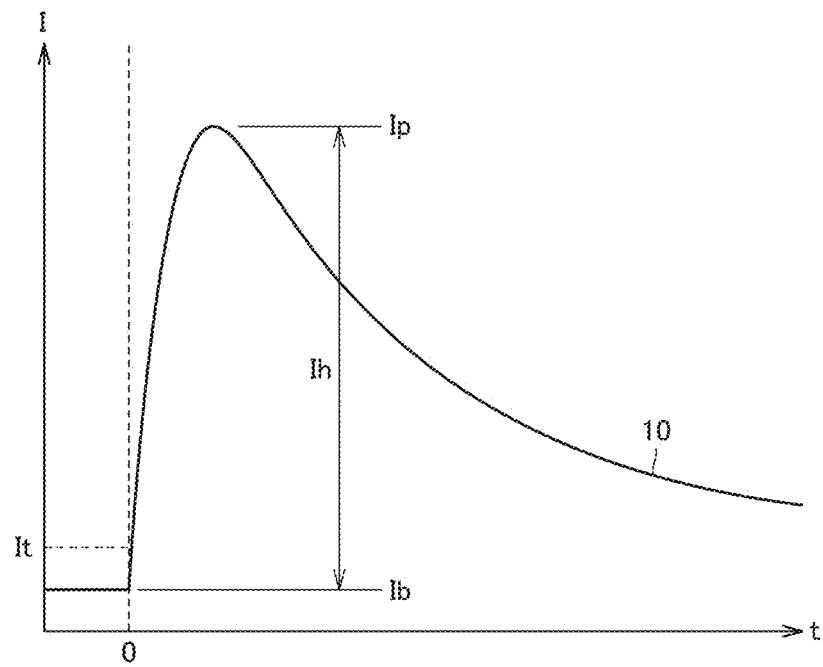
FIG. 2 is a diagram for illustrating an analysis item A.

FIG. 2 is a diagram for illustrating analysis item A.

As one example, FIG. 2 shows a pulse waveform 40 of the leakage current measured by measuring instrument 5. Time t is indicated on the horizontal axis, and a leakage current I is indicated on the vertical axis. Prior to time 0 on the time axis, leakage current I is Ib. The value of Ib is less than threshold It. At time 0, leakage current I is beyond threshold It. This causes measuring instrument 5 to start recording a pulse waveform. The leakage current indicates a pulsating change. Leakage current I is Ip at a peak of the pulse. Analyzer 6 calculates a difference Ih between Ip and Ib as the magnitude of the pulse.

Analyzer 6 evaluates the reliability of test semiconductor devices 1-1 through 1-N included in test circuit 2, based on temporal characteristics of multiple pulse waveforms recorded with respect to test semiconductor devices 1-1 through 1-N, and temporal characteristics of multiple pulse waveforms with respect to the reference semiconductor device.

Figure 3:
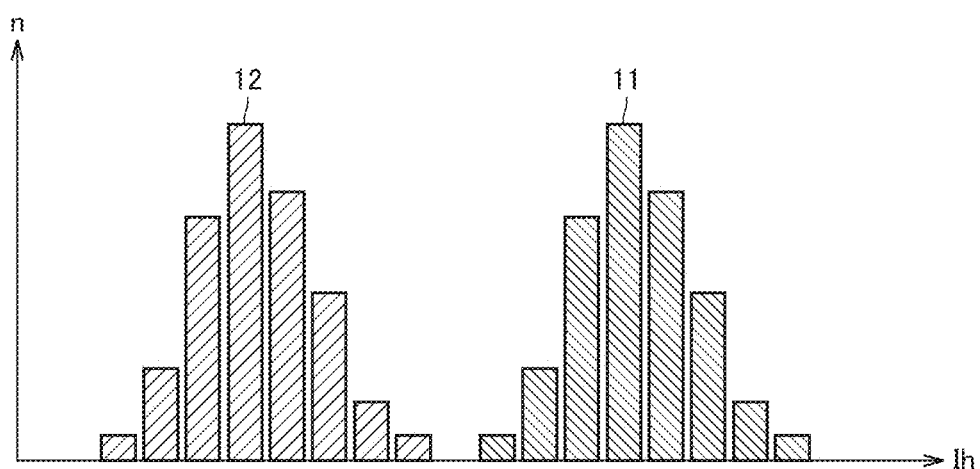
FIG. 3 is a diagram for illustrating an example difference in magnitude Ih of a pulse, obtained by analysis item A, between a database for test semiconductor devices 1-1 through 1-N and a database for a reference semiconductor device.

FIG. 3 is a diagram for illustrating an example difference in magnitude Ih of the pulse obtained by analysis item A between the database of test semiconductor devices 1-1 through 1-N and the database of the reference semiconductor device. Ih is indicated on the horizontal axis, and an incidence of the pulse is indicated on the vertical axis. FIG. 3 shows a histogram 11 indicating a distribution of Ih in the database of test semiconductor devices 1-1 through 1-N, and a histogram 12 of Ih in the database of the reference semiconductor device.

Referring to histograms 11 and 12, an average of Ih in the database of test semiconductor devices 1-1 through 1-N is greater than an average of Ih in the database of the reference semiconductor device. Moreover, the mode where the frequency of Ih in the database of test semiconductor devices 1-1 through 1-N is at a maximum is greater than the mode where the frequency of Ih in the database of the reference semiconductor device is at a maximum. This means that the leakage current of test semiconductor devices 1-1 through 1-N caused by the radiation being emitted thereto is great and test semiconductor devices 1-1 through 1-N are easily destroyed by the radiation, as compared to the reference semiconductor device. Accordingly, analyzer 6 can estimate that LTDS of test semiconductor devices 1-1 through 1-N are less than LTDS of the reference semiconductor device.

Analyzer 6 can estimate a difference between LTDS of the reference semiconductor device and LTDS of a test semiconductor device, based on the average or the mode of Ih in the database of test semiconductor devices 1-1 through 1-N and the average or the mode of Ih in the database of the reference semiconductor device. In other words, the greater the difference between the average or the mode of Ih in the database of test semiconductor devices 1-1 through 1-N and the average or the mode of Ih in the database of the reference semiconductor device, the greater the difference the analyzer 6 estimates between LTDS of test semiconductor devices 1-1 through 1-N and LTDS of the reference semiconductor device.

Analyzer 6 calculates a ratio (D1/D2) of a difference D1 and a difference D2, the difference D1 being a difference between the reciprocal (1/IHM1) of the average or the mode IHM1 of Ih in a database of a first test semiconductor device and the reciprocal (1/IHMR) of the average or the mode IHMR of Ih in the database of the reference semiconductor device, the difference D2 being a difference between the reciprocal (1/IHM2) of the average or the mode IIHM2 of Ih in the database of a second test semiconductor device and the reciprocal (1/IHMR) of the average or the mode IHMR of Ih in the database of the reference semiconductor device. Analyzer 6 can regard the ratio (D1/D2) as the ratio of LTDS of the first test semiconductor device and LTDS of the second test semiconductor device.

Thus, according to the semiconductor device reliability evaluation apparatus of the present embodiment, LTDS of the semiconductor device can be estimated, without having to wait for the semiconductor device to be actually destroyed. This can reduce a significant amount of time required for the evaluation, thereby shortening the development time of the semiconductor device and reducing the development cost. In the present embodiment, while a histogram of analysis item A needs to be created for the test semiconductor device, the time taken to create the histogram is much shorter than a time waiting for a test semiconductor device to be actually destroyed.

According to the present embodiment, the failure rate can be estimated from characteristics of minute variations in leakage current that do not contribute to destruction of semiconductor devices.

Note that the semiconductor device reliability evaluation apparatus according to the present embodiment can estimate LTDS of a test semiconductor device, without having to emit artificial radiation from a radiation producing apparatus to the test semiconductor device. The semiconductor device reliability evaluation apparatus according to the present embodiment can also estimate LTDS of a test semiconductor device, using artificial radiation emitted by a radiation producing apparatus and cosmic ray-derived radiation.

Note that the semiconductor device reliability evaluation apparatus according to the present embodiment can estimate LTDS with higher accuracy by being installed in an appropriate location depending on environment in which the semiconductor device is actually used. For example, for a semiconductor device that is used on a low-altitude ground, installing the reliability evaluation apparatus according to the present embodiment on the ground allows determination of LTDS that is the same as it is when the semiconductor device is actually used. In contrast, for a semiconductor device that is used on a high-altitude ground or a semiconductor device that is used in an aircraft or space ship at a high altitude, installing the reliability evaluation apparatus according to the present embodiment in environment accordingly allows determination of LTDS that is the same as it is when the semiconductor device is actually used.

Embodiment 2

In Embodiment 2, analyzer 6 analyzes an analysis item B. Analysis item B is duration of a pulse. The duration of pulse corresponds to a temporal width of pulse. The duration of pulse can be from a time the leakage current has exceeded a determined threshold until a time the leakage current has decreased to a determined threshold.

Figure 4:
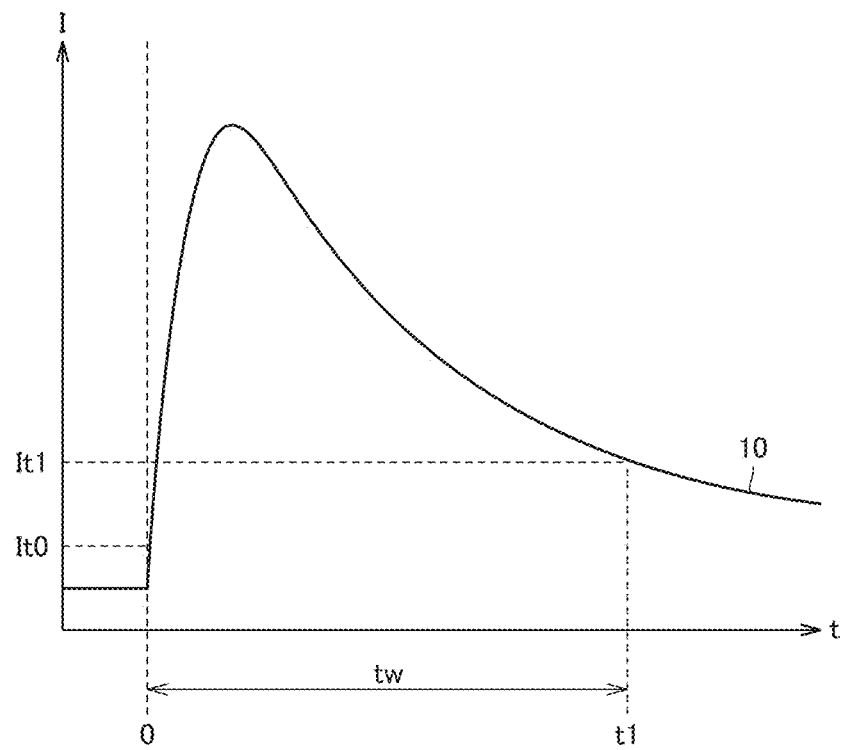
FIG. 4 is a diagram for illustrating analysis item B.

FIG. 4 is a diagram for illustrating analysis item B. As one example, FIG. 4 shows a pulse waveform 40 of a leakage current measured by measuring instrument 5. In FIG. 4, time t is indicated on the horizontal axis, and the magnitude of a leakage current I is indicated on the vertical axis.

At time 0 on the time axis, leakage current I exceeds a first threshold It0. As a result, measuring instrument 5 records a waveform. It0 may have the same value as It according to Embodiment 1. The Leakage current I changes in pulse forms. The Leakage current I increases until it reaches the peak, and then decreases. At time t1, leakage current I is less than a second threshold It1. Analyzer 6 calculates a time period from time 0 to time t1 as a duration tw of the pulse.

First threshold It0 and second threshold It1 may be different thresholds or the same threshold. In the example of FIG. 4, second threshold It1 is set higher than first threshold It0. In a measurement with a greater second threshold It1 (hereinafter, first measurement), duration tw of pulse is shorter. The first measurement is a normal measurement focusing on the main part of the pulse. In contrast, in a measurement with a lower second threshold It1 (hereinafter, s second measurement), duration tw of pulse is longer. The second measurement focuses on the falling wing, that is, the tail of the pulse. If the internal temperatures of semiconductor devices 1-1 through 1-N are increased, heat is generated due to the leakage current. Consequently, semiconductor devices 1-1 through 1-N cannot be turned off by controlling the gates of semiconductor devices 1-1 through 1-N, which may destroy semiconductor devices 1-1 through 1-N. The effects of the heat generation can be evaluated by performing the measurement, focusing on the current waveform of the tail of the pulse. The characteristics of the pulse shape can be more accurately captured by performing both the first and second measurements. Accordingly, multiple second thresholds It1 are set, duration tw corresponding to each It1 is determined and recorded in the database of test semiconductor devices 1-1 through 1-N, thereby allowing more flexible comparison of duration tw.

Figure 5:
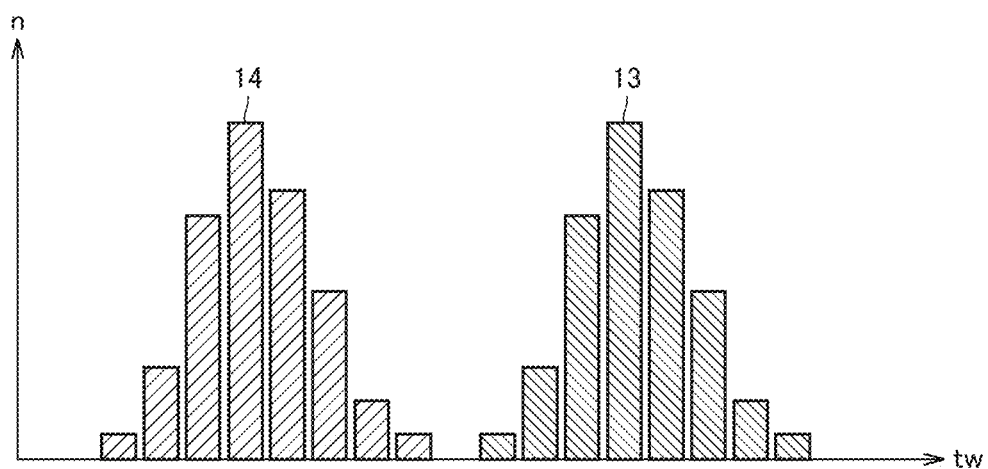
FIG. 5 is a diagram for illustrating an example difference in duration tw of a pulse, obtained by analysis item B, between a database for test semiconductor devices 1-1 through 1-N and a database for the reference semiconductor device.

FIG. 5 is a diagram for illustrating an example difference in duration tw of the pulse obtained by analysis item B between the database of test semiconductor devices 1-1 through 1-N and the database of the reference semiconductor device. In FIG. 5, duration tw of pulse is indicated on the horizontal axis, and an incidence of the pulse is indicated on the vertical axis. FIG. 5 shows a histogram 13 indicating a distribution of durations tw of pulses in the database of test semiconductor devices 1-1 through 1-N, and a histogram 14 of duration tw of pulses in the database of the reference semiconductor device.

Referring to histograms 13 and 14, the average of tw in the database of test semiconductor devices 1-1 through 1-N is greater than the average of tw in the database of the reference semiconductor device. Moreover, the mode where the frequency of tw in the database of test semiconductor devices 1-1 through 1-N is at a maximum is greater than the mode where the frequency of tw in the database of the reference semiconductor device is at a maximum. This suggests that a leakage current, which is caused by emission of radiation, flows through test semiconductor devices 1-1 through 1-N longer than the reference semiconductor device, indicating that test semiconductor devices 1-1 through 1-N are susceptible to destruction by the radiation. Accordingly, analyzer 6 can estimate that LTDS of test semiconductor devices 1-1 through 1-N is less than LTDS of the reference semiconductor device.

Analyzer 6 can estimate the difference between LTDS of the reference semiconductor device and LTDS of test semiconductor devices 1-1 through 1-N, based on the difference between the average or the mode of tw in the database of test semiconductor devices 1-1 through 1-N and the average or the mode of tw in the database of the reference semiconductor device. In other words, the greater the difference between the average or the mode of tw in the database of test semiconductor devices 1-1 through 1-N and the average or the mode of tw in the database of the reference semiconductor device, the greater the difference the analyzer 6 estimates between LTDS of test semiconductor devices 1-1 through 1-N and LTDS of the reference semiconductor device.

Analyzer 6 calculates a ratio (E1/E2) of a difference E1 and a difference E2, the difference E1 being a difference between the average or the reciprocal (1/TWM1) of the mode TWM1 of tw in a database of first test semiconductor devices 1-1 through 1-N and the average or the reciprocal (1/TWMR) of the mode TWMR of tw in the database of the reference semiconductor device, the difference E2 being a difference between the average or the reciprocal (1/TWM2) of the mode TWM2 of tw in a database of a second test semiconductor device and the average or the reciprocal (1/TWMR) of the mode TWMR of tw in the database of the reference semiconductor device. Analyzer 6 can regard the ratio (E1/E2) as the ratio of LTDS of first test semiconductor devices 1-1 through 1-N and LTDS of the second test semiconductor device.

Note that analyzer 6 may compare tw corresponding to multiple It1 with each other to determine an estimate of LTDS with higher accuracy.

Embodiment 3

In Embodiment 3, analyzer 6 analyzes an analysis item C. Analysis item C is an incidence of pulse. The incidence of pulse can be a total number of times of occurrence, in a unit time, of a pulse that causes leakage current I above a threshold.

Figure 6:
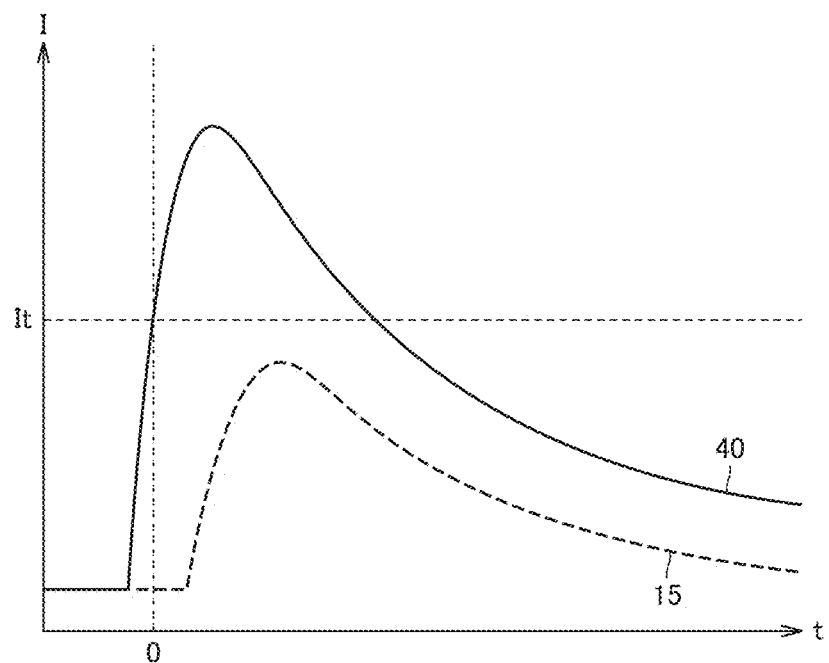
FIG. 6 is a diagram for illustrating an analysis item C.

FIG. 6 is a diagram for illustrating analysis item C. As one example, FIG. 6 shows a pulse waveform 40 of a leakage current measured by measuring instrument 5. Time t is indicated on the horizontal axis, and leakage current I is indicated on the vertical axis. Leakage current I exceeds threshold It at time 0 on the time axis. As a result, measuring instrument 5 records a waveform. Analyzer 6 calculates the incidence of pulse per unit time, based on the number of times a waveform is recorded. As indicated by waveform 15 of FIG. 6, even if leakage current I has varied instantaneously, a waveform is not recorded if leakage current I does not exceed threshold It. An incidence of pulse that is more correlated to LTDS can be calculated by setting threshold It to an appropriate value.

Figure 7:
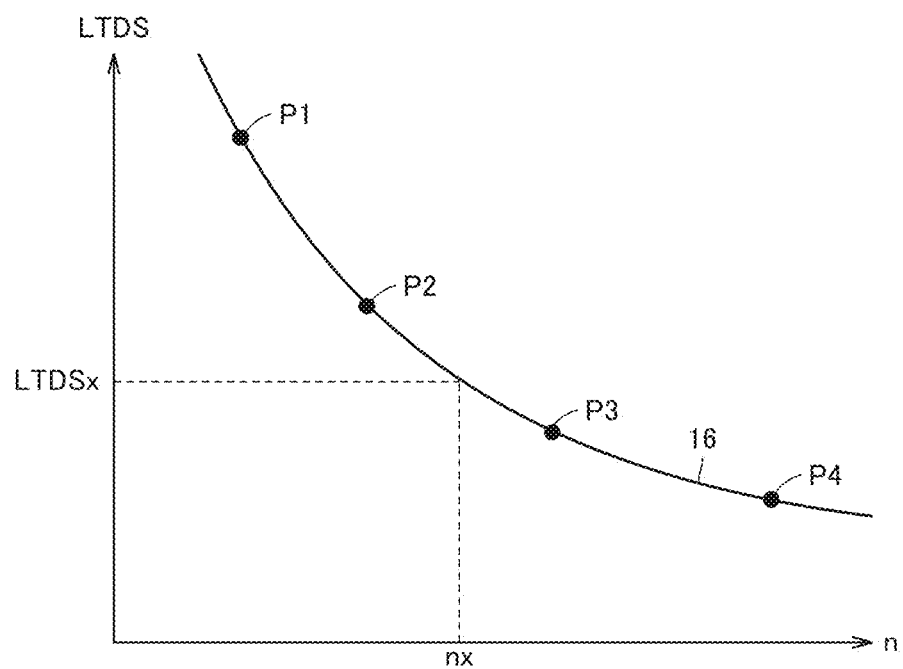
FIG. 7 is a diagram for illustrating a method of estimation of LTDS, based on an incidence of pulse.

FIG. 7 is a diagram for illustrating a method of estimation of LTDS based on an incidence of pulse. In FIG. 7, an incidence n of pulse is indicated on the horizontal axis, and LTDS is indicated on the vertical axis. FIG. 7 shows sample points P1 through P4 representing the relationship between the incidence of pulse and LTDS of four types of known reference semiconductor devices. In FIG. 7, the curve connecting sample points P1 through P4 is indicated as a curve 16 representing the correlation between incidence n and LTDS. As indicated by curve 16, a semiconductor device having a higher incidence n of pulse has less LTDS, and a semiconductor device having a lower incidence n of pulse has a greater LTDS.

Analyzer 6 can refer to curve 16 to determine LTDS of test semiconductor devices 1-1 through 1-N for an incidence nx of pulse on curve 16, as LTDSx.

Embodiment 4

Analyzer 6 may combine and analyze at least two of analysis items A, B, and C. For example, analyzer 6 can calculate an amount of electric charges generated by the measured pulse waveform by integrating the pulse waveform over the duration specified by analysis item B. After the analysis of these analysis items, analyzer 6 saves analysis results therein, and updates the database of test semiconductor devices 1-1 through 1-N.

Figure 8:
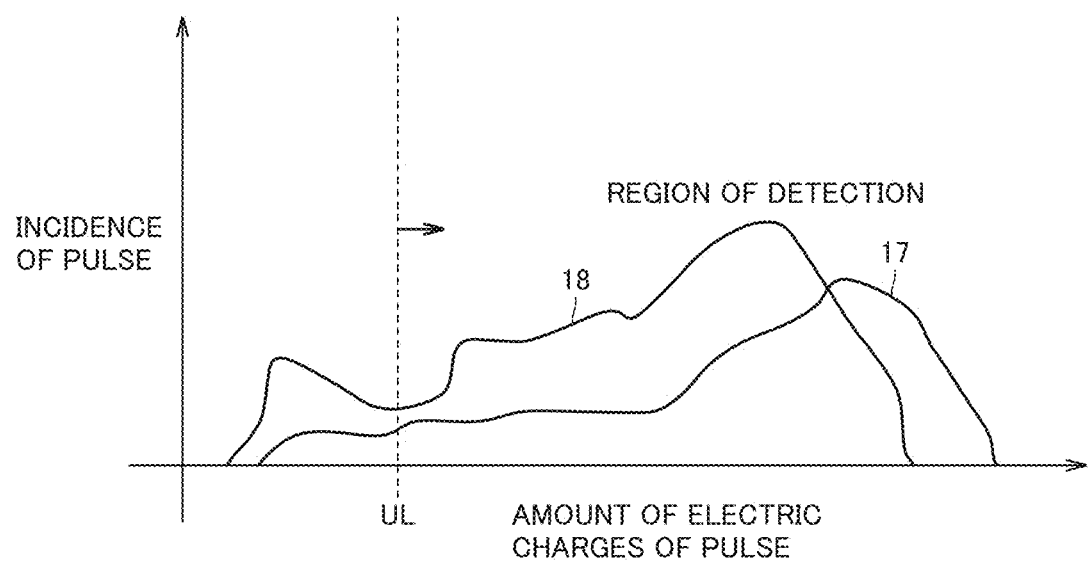
FIG. 8 is a diagram representing a distribution of electric charges of test semiconductor devices 1-1 through 1-N and a distribution of electric charges of the reference semiconductor device.

FIG. 8 is a diagram representing a distribution of electric charges of test semiconductor devices 1-1 through 1-N and a distribution of electric charges of a reference semiconductor device. In FIG. 8, an amount of electric charges of pulse is indicated on the horizontal axis, and an incidence of pulse is indicated on the vertical axis. The amount of electric charges of pulse is calculated from current waveforms obtained by measuring instrument 5 and the duration of the pulse obtained by analysis item B. The incidence of pulse is obtained by analysis item C.

FIG. 8 shows a distribution 17 of electric charges of test semiconductor devices 1-1 through 1-N and a distribution 18 of electric charges of the reference semiconductor device. The electric charge distribution depends on a device structure of a semiconductor device and LTDS of the semiconductor device. Thus, analyzer 6 can estimate LTDS of test semiconductor devices 1-1 through 1-N by comparing the electric charge distribution of a reference semiconductor device whose LTDS is known and the electric charge distribution of test semiconductor devices 1-1 through 1-N.

For example, if the incidence of pulse of test semiconductor devices 1-1 through 1-N is higher than the incidence of pulse of the reference semiconductor device in a region where the amount of electric charges of pulse is large, analyzer 6 can estimate that LTDS of test semiconductor devices 1-1 through 1-N is less than LTDS of the reference semiconductor device. If the incidence of pulse of test semiconductor devices 1-1 through 1-N is lower than the incidence of pulse of the reference semiconductor device in a region where the amount of electric charges of pulse is large, analyzer 6 can estimate that LTDS of test semiconductor devices 1-1 through 1-N is greater than LTDS of the reference semiconductor device.

As shown in FIG. 8, lower limit UL of detection of the amount of electric charges of pulse may be provided. Lower limit UL of detection of the amount of electric charges of pulse can be a product of duration tw of pulse and first threshold It0. When the amount of electric charges of a pulse is greater than or equal to first threshold It0, the pulse waveform is recorded and becomes a subject of analysis. Lower limit UL of detection can be adjusted to an appropriate value by adjusting first threshold It0. As a result, only a pulse waveform that is highly correlated to LTDS can be a subject of analysis.

Embodiment 5

While Embodiment 1 describes the method of estimation of electric charges that are generated by changes in leakage current over time calculated from current detection unit 4, the present disclosure is not limited thereto.

Figure 9:
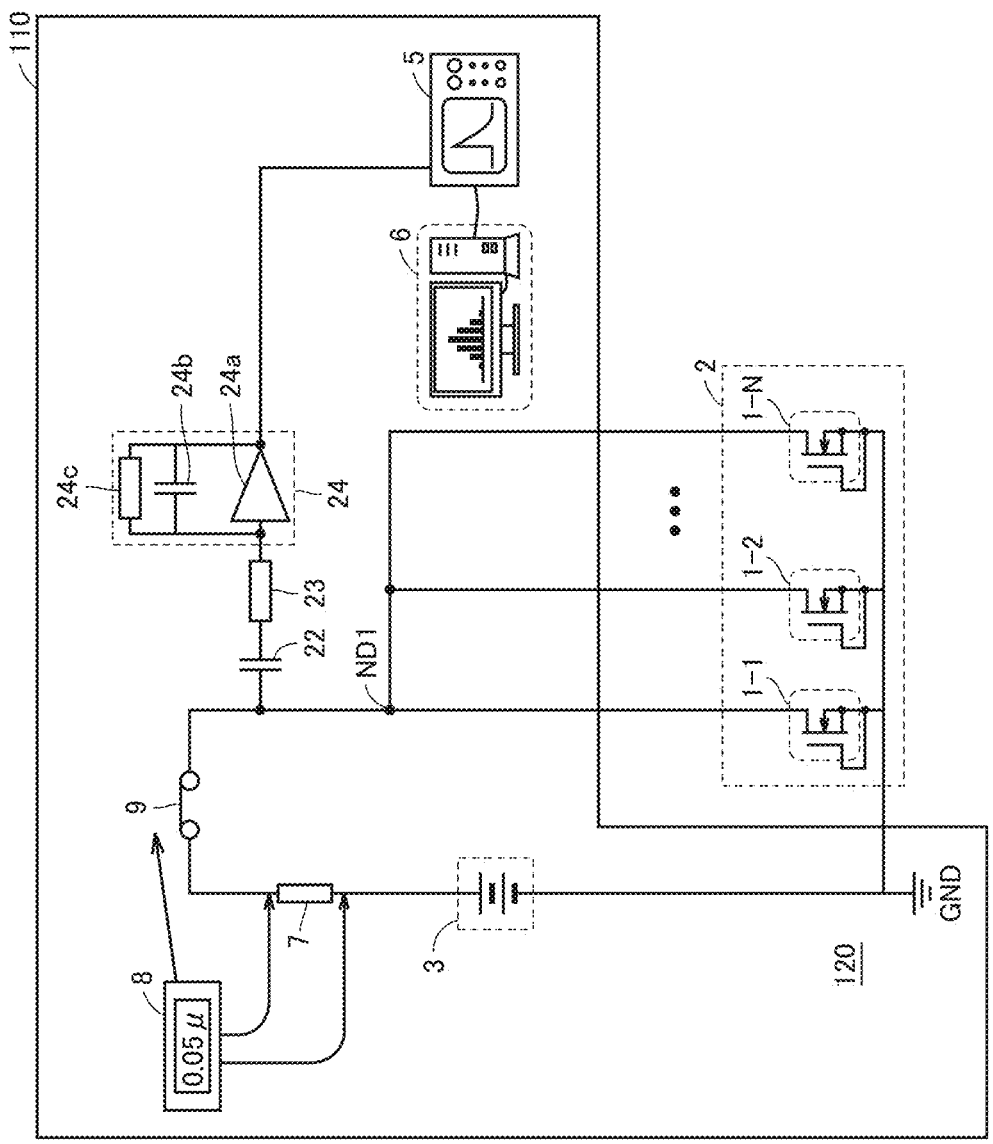
FIG. 9 is a block diagram of a semiconductor device reliability evaluation apparatus 110 according to Embodiment 5.

FIG. 9 is a block diagram of a semiconductor device reliability evaluation apparatus 110 according to Embodiment 5.

Instead of current detection unit 4, reliability evaluation apparatus 110 includes an integrator 24, a capacitor 22 for electric charge supply, and a limiting resistor 23.

Semiconductor devices 1-1 through 1-N are connected in parallel, thereby forming a test circuit 2. The same voltage is applied to semiconductor devices 1-1 through 1-N.

Semiconductor devices 1-1 through 1-N each have the drain terminal or the collector terminal connected to a node ND1. Semiconductor devices 1-1 through 1-N each have the source terminal or the emitter terminal connected to a ground GND. In order to prevent breakthrough of the self turn-off devices, the gate terminals or the base terminals of semiconductor devices 1-1 through 1-N are shorted to the source terminals or the emitter terminals of semiconductor devices 1-1 through 1-N.

DC power supply 3, protection resistor 7, switch 9, and test circuit 2 form a closed circuit 120. DC power supply 3 has one end connected to one end of protection resistor 7. DC power supply 3 has the other end connected to ground GND. Protection resistor 7 has the other end connected to one end of switch 9. Switch 9 has the other end connected to node ND1. Test circuit 2 is connected to node ND1 and ground GND.

Capacitor 22 for electric charge supply has one end connected to node ND1. Capacitor 22 for electric charge supply has the other end connected to one end of limiting resistor 23. Limiting resistor 23 has the other end connected to an input of integrator 24. Integrator 24 has an output connected to measuring instrument 5.

Currents, having pulse forms, flow through semiconductor devices 1-1 through 1-N are detected by integrator 24. The use of integrator 24 allows accurate measurement of pulse currents that are generated in semiconductor devices 1-1 through 1-N.

Integrator 24 includes an operational amplifier 24$a$, a capacitor 24$b$, and a resistor 24$c$, which are connected in parallel. While the magnitude of current obtained by integrator 24 does not have pulse forms, the magnitude of pulse and the duration of the pulse of the leakage current are reflected to an integrated waveform, which is a result of integration by integrator 24. Even with the use of integrated waveform, the incidence of pulse can also be detected by adjusting, for example, a time constant. Accordingly, analyzer 6 can analyze the pulse waveform, based on analysis items A, B, C as with Embodiments 1 to 3, by analyzing an integrated waveform, provided that thresholds It0, It1, and It according to Embodiment 5 are different from thresholds It0, It1, and It according to Embodiment 1.

Embodiment 6

Figure 10:
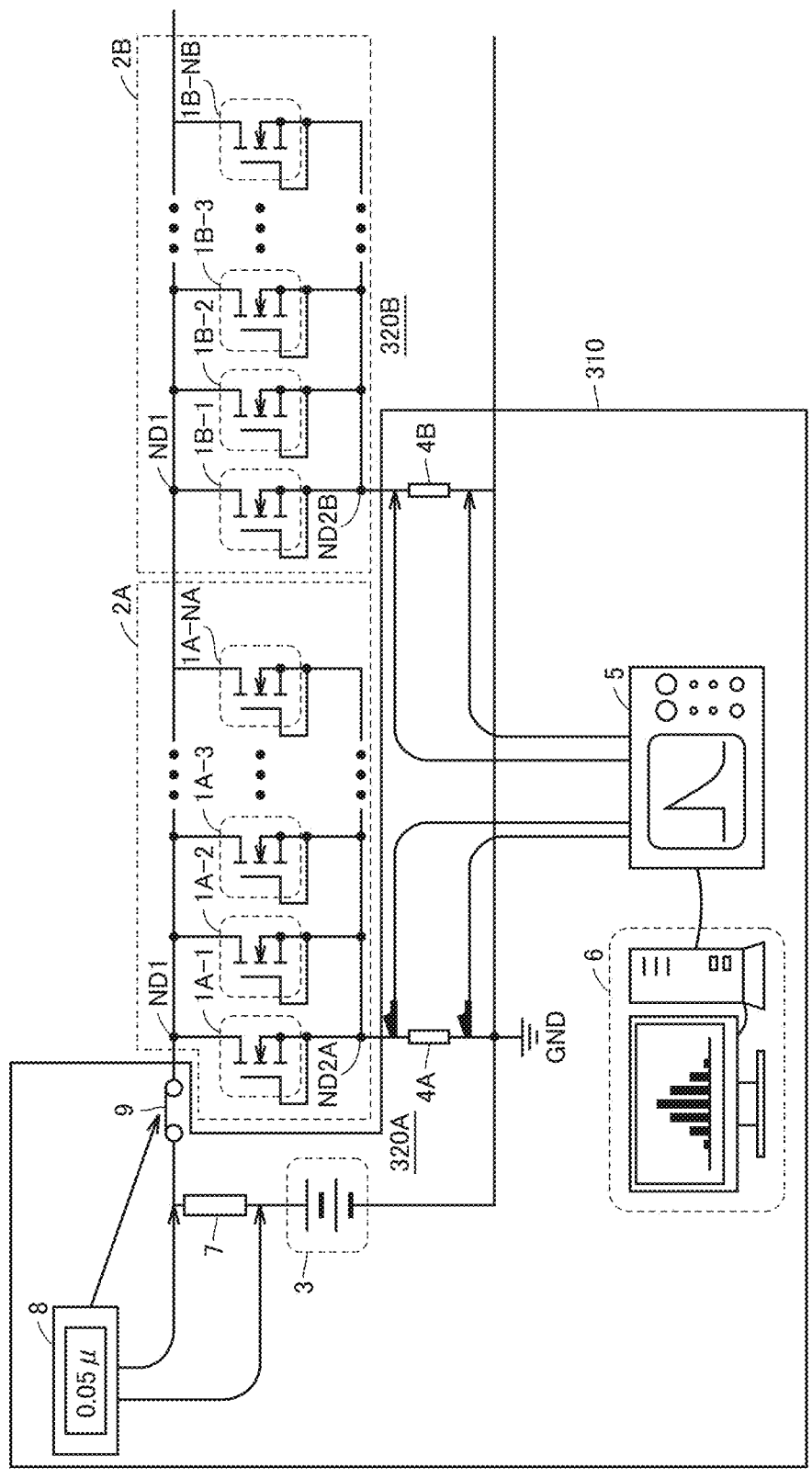
FIG. 10 is a block diagram of a semiconductor device reliability evaluation apparatus 310 according to Embodiment 6.

FIG. 10 is a block diagram of a semiconductor device reliability evaluation apparatus 310 according to Embodiment 6.

FIG. 10 shows NA self turn-off semiconductor devices 1A-1 through 1A-NA, and NB self turn-off semiconductor devices 1B-1 through 1B-NB.

Semiconductor devices 1A-1 through 1A-NA are connected in parallel, thereby forming a first-phase test circuit 2A. The same voltage is applied to semiconductor devices 1A-1 through 1A-NA. Semiconductor devices 1A-1 through 1A-NA each have the drain terminal or the collector terminal connected to a node ND1.

Semiconductor devices 1A-1 through 1A-NA each have the source terminal or the emitter terminal connected to a node ND2A. In order to prevent breakthrough of the self turn-off devices, the gate terminals or the base terminals of semiconductor devices 1A-1 through 1A-NA are shorted to the source terminals or the emitter terminals of semiconductor devices 1A-1 through 1A-NA.

Semiconductor devices 1B-1 through 1B-NB are connected in parallel, thereby forming a second-phase test circuit 2B. The same voltage is applied to semiconductor devices 1B-1 through 1B-NB. Semiconductor devices 1B-1 through 1B-NB each have the drain terminal or the collector terminal connected to a node ND1. Semiconductor devices 1B-1 through 1B-NB each have the source terminal or the emitter terminal connected to a node ND2B. In order to prevent breakthrough of the self turn-off devices, the gate terminals or the base terminals of semiconductor devices 1B-1 through 1B-NB are shorted to the source terminals or the emitter terminals of semiconductor devices 1B-1 through 1B-NB.

Reliability evaluation apparatus 310 according to the present embodiment evaluates overall reliability of NA semiconductor devices 1A-1 through 1A-NA included in test circuit 2A, and evaluates overall reliability of NB semiconductor devices 1B-1 through 1B-NB included in test circuit 2B. If NA semiconductor devices 1A-1 through 1A-NA included in test circuit 2A and NB semiconductor devices 1B-1 through 1B-NB included in test circuit 2B are configured with the same specification, overall reliability of test circuit 2A and overall reliability of test circuit 2B can be evaluated simultaneously.

Reliability evaluation apparatus 310 includes a DC power supply 3, a current detection unit 4, a voltmeter 8, a protection resistor 7, a switch 9, a measuring instrument 5, and an analyzer 6. Current detection unit 4 includes a current detector 4A and a current detector 4B.

DC power supply 3, protection resistor 7, switch 9, first-phase test circuit 2A, and voltmeter 8 form a closed circuit 320A. DC power supply 3 has one end connected to one end of protection resistor 7. DC power supply 3 has the other end connected to a ground GND. Protection resistor 7 has the other end connected to one end of switch 9. Switch 9 has the other end connected to node ND1. Test circuit 2A connects node ND1 and node ND2A. Current detector 4A has one end connected to node ND2A. Current detector 4A has the other end connected to ground GND.

DC power supply 3, protection resistor 7, switch 9, second-phase test circuit 2B, and voltmeter 8 form a closed circuit 320B. Test circuit 2B connects node ND1 and node ND2B. Current detector 4B has one end connected to node ND2B. Current detector 4B has the other end connected to ground GND.

When radiation is incident on any of semiconductor devices 1A-1 through 1A-NA, an electric charge is generated within the semiconductor device (e.g., 1A-i) on which the radiation is incident. As a result, the resistance of semiconductor device 1A-i decreases. This causes an electric charge Q to be supplied to semiconductor device 1A-i from the remaining (NA−1) semiconductor devices connected in parallel. Electric charge Q within semiconductor device 1A-i and electric charges that flow from (NA−1) semiconductor devices, represented by (NA−1)× Q, are stored in semiconductor device 1A-i. Accordingly, the electric charge, represented by NA×Q, is stored in semiconductor device 1A-i. Electric charge Q is calculated by a product of an output capacity Coss of each semiconductor device and a voltage Vds applied to the semiconductor device. As the electric charge NA×Q within semiconductor device 1A-i increases greater than or equal to a threshold electric charge Qth, which is required to destroy semiconductor device 1A-i, semiconductor device 1A-i is destroyed. Accordingly, in order to prevent semiconductor device 1A-i from being destroyed, NA, Coss, and Vds are set so that NA×Coss×Vds is less than Qth. As Qth, a value can be used which is registered in the database of a reference semiconductor device for a device whose failure rate is known. Alternatively, the value of Qth may be estimated, using device simulation.

Current detector 4A measures the voltage between node ND2A and ground GND, thereby detecting the current flow through test circuit 2A. Current detector 4A measures the overall leakage current of semiconductor device 1A-1 through 1A-NA while an off-voltage is being applied to the gate terminals or the base terminals of semiconductor devices 1A-1 through 1A-NA. Current detector 4A is configured of a current probe or a resistor.

If current detector 4A is configured of a resistor, a time constant τA is set at least above 1 μs, the time constant τA being a product (RA×NA×Coss) of a resistance RA of current detector 4A and the sum (NA×Coss) of the output capacities of NA semiconductor devices 1A-1 through 1A-NA within test circuit 2A. If time constant τA is less than or equal to 1 μs, the peak value of the current flow through current detector 4A increases and less time is taken for the current to flow through current detector 4A. If the current flows through current detector 4A for a short time, it will become difficult to detect the height of pulse, the duration of pulse, and the incidence of pulse.

When radiation is incident on any of semiconductor devices 1B-1 through 1B-NB, an electric charge is generated within the semiconductor device (e.g., 1B-i) on which the radiation is incident. As a result, the resistance of semiconductor device 1B-i decreases. This causes an electric charge Q to be supplied to semiconductor device 1B-i from the remaining (NB−1) semiconductor devices connected in parallel. Electric charge Q within semiconductor device 1B-i and electric charges that flow from (NB−1) semiconductor devices, represented by (NB−1)×Q, are stored in semiconductor device 1B-i. Accordingly, the electric charge, represented by NB×Q, is stored in semiconductor device 1B-i. Electric charge Q is calculated by a product of output capacity Coss of each semiconductor device and voltage Vds applied to the semiconductor device. As the electric charge NB×Q within semiconductor device 1B-i increases greater than or equal to a threshold electric charge Qth, which is required to destroy semiconductor device 1B-i, semiconductor device 1B-i is destroyed. Accordingly, in order to prevent semiconductor device 1B-i from being destroyed, NB, Coss, and Vds are set so that NB×Coss×Vds is less than Qth. As Qth, a value can be used which is registered in a database of a reference semiconductor device for a device whose failure rate is known. Alternatively, the value of Qth may be estimated, using device simulation.

Current detector 4B measures the voltage between node ND2B and ground GND, thereby detecting the current flow through test circuit 2B. Current detector 4B measures the overall leakage current of semiconductor device 1B-1 through 1B-NB while an off-voltage is being applied to the gate terminals or the base terminals of semiconductor devices 1B-1 through 1B-NB. Current detector 4B is configured of a current probe or a register.

Measuring instrument 5 records a first pulse waveform of the leakage current detected by current detector 4A, and a second pulse waveform of the leakage current detected by current detector 4B.

Based on the recorded first pulse waveform, analyzer 6 analyzes the reliability of test semiconductor devices 1A-1 through 1A-NA included in test circuit 2A. Based on the recorded second pulse waveform, analyzer 6 analyzes the reliability of test semiconductor devices 1B-1 through 1B-NB included in test circuit 2B.

If current detector 4B is configured of a resistor, a time constant TB is set at least above 1 μs, the time constant TB being a product (RB×NB×Coss) of a resistance RB of current detector 4B and the sum (NB×Coss) of the output capacities of NB semiconductor devices 1B-1 through 1B-NB within test circuit 20B. If time constant TB is less than or equal to 1 μs, the peak value of the current flow through current detector 4B increases and less time is taken for the current to flow through current detector 4B. If the current flows through current detector 4B for a short time, it will become difficult to detect the height of pulse, the duration of pulse, and the incidence of pulse.

If one test circuit includes a large number of semiconductor devices connected in parallel, the electric charge is supplied to a semiconductor device, whose resistance is reduced by incident of cosmic ray-derived radiation, from semiconductor devices connected in parallel to the semiconductor device. This causes reduction in amount of current that flows through the current detector, resulting in an increased likelihood that variations in leakage current when cosmic ray-derived radiation is incident on a semiconductor device is not measurable. Embodiment 6 allows one test circuit to include only a small number of semiconductor devices connected in parallel. This allows maintaining the detection sensitivity for the leakage current when cosmic ray-derived radiation is incident on a semiconductor device even if a large number of test semiconductor device is present.

While the reliability evaluation apparatus of FIG. 10 is connected to a two-phase test circuit, it should be noted that the present disclosure is not limited thereto. A test circuit having more than two phases may be connected to the reliability evaluation apparatus, and a current detector may be provided for each phase.

Embodiment 7

Figure 11:
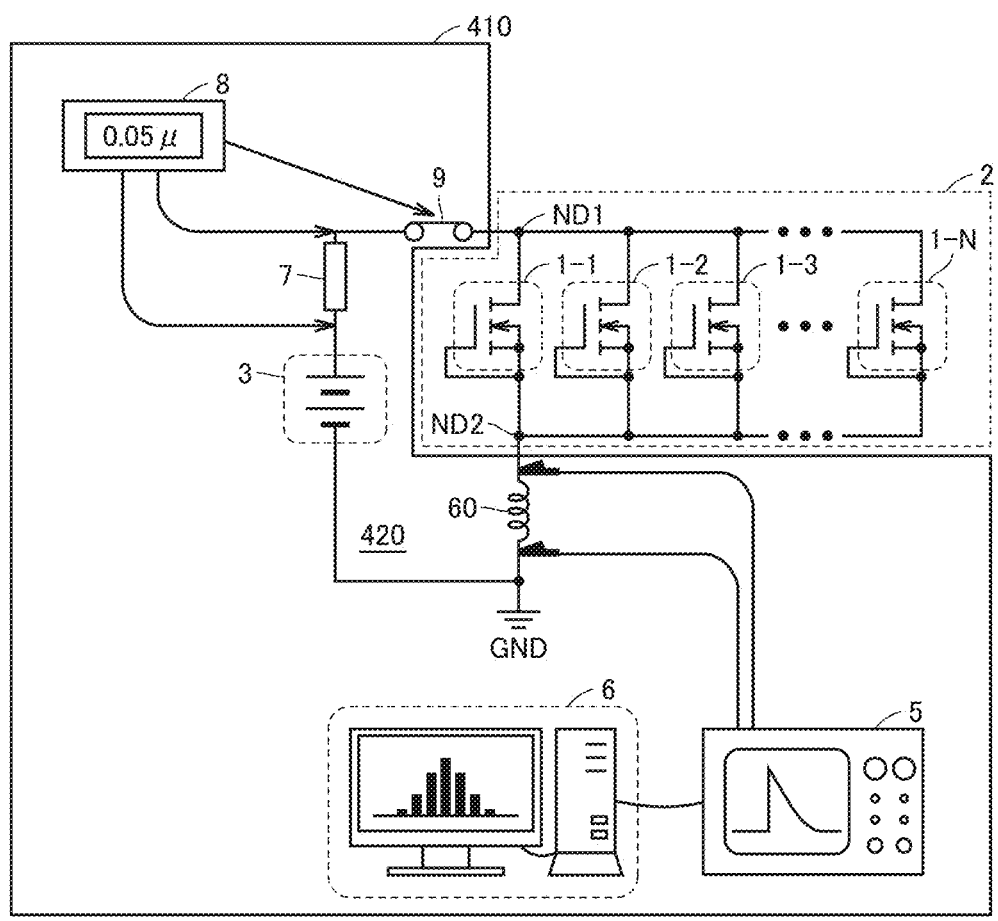
FIG. 11 is a block diagram of a semiconductor device reliability evaluation apparatus 410 according to Embodiment 7.

FIG. 11 is a block diagram of a semiconductor device reliability evaluation apparatus 410 according to Embodiment 7.

Reliability evaluation apparatus 410 of FIG. 11 is different from reliability evaluation apparatus 10 of FIG. 1, in that reliability evaluation apparatus 410 includes a current detection unit 60, instead of current detection unit 4.

Current detection unit 60 includes an inductive load formed of an inductance component, such as an air core coil.

The rate of increase of the current is ip/tp, where ip indicates the peak value of a current having pulse forms, and tp indicates a time taken for the current to reach the peak. In the present embodiment, since current detection unit 60 is an inductive load, a voltage V1 (=L*ip/tp) is generated across the current detection unit 60, where L indicates inductance of the inductive load. In contrast, if current detection unit 4 is a resistive load as in Embodiment 1, a voltage V2 (R*ip) is generated across the current detection unit 4, where R indicates resistance of the resistive load. If the subject of detection is a pulse current that is steep in a short time, ip/tp is large, and thus measurement sensitivity in the case of the inductive load is higher than the resistive load.

Embodiment 8

Figure 12:
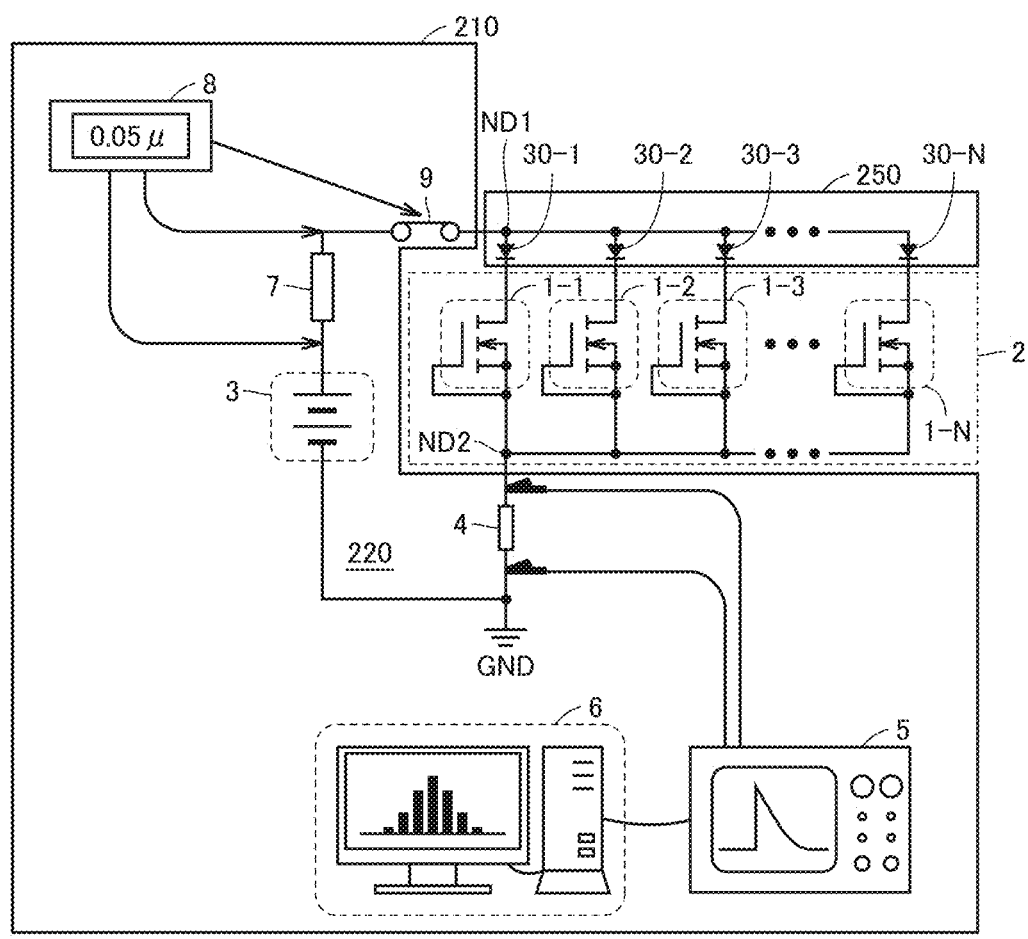
FIG. 12 is a block diagram of a semiconductor device reliability evaluation apparatus 210 according to Embodiment 8.

FIG. 12 is a block diagram of a semiconductor device reliability evaluation apparatus 210 according to Embodiment 8.

Reliability evaluation apparatus 210 according to Embodiment 8 of FIG. 12 includes a rectifier circuit 250, in addition to the components of reliability evaluation apparatus 10 according to Embodiment 1 of FIG. 1. Rectifier circuit 250 includes diodes 30-1 through 30-N.

Semiconductor devices 1-1 through 1-N are connected in parallel, thereby forming a test circuit 2. The same voltage is applied to semiconductor devices 1-1 through 1-N. Semiconductor devices 1-1 through 1-N each have the source terminal or the emitter terminal connected to a node ND2. In order to prevent breakthrough of the self turn-off devices, the gate terminals or the base terminals of semiconductor devices 1-1 through 1-N are shorted to the source terminals or the emitter terminals of semiconductor devices 1-1 through 1-N.

A DC power supply 3, a protection resistor 7, a switch 9, a rectifier circuit 250, a test circuit 2, and a voltmeter 8 form a closed circuit 220. DC power supply 3 has one end connected to one end of protection resistor 7. DC power supply 3 has the other end connected to a ground GND. Protection resistor 7 has the other end connected to one end of switch 9. Switch 9 has the other end connected to a node ND1. Rectifier circuit 250 and test circuit 2 are connected in series between node ND1 and node ND2. Current detection unit 4 has one end connected to node ND2. Current detection unit 4 has the other end connected to ground GND.

Diode 30-i is disposed between node ND1 and the drain terminal or the collector terminal of semiconductor device 1-i.

As radiation is incident on one semiconductor device 1-i and an electric charge is generated instantaneously within that semiconductor device 1-i, the resistance of semiconductor device 1-i decreases. Diode 30-i is connected to semiconductor device 1-i in forward direction. In other words, diode 30-i has the anode connected to node ND1, and the cathode connected to the drain terminal or the collector terminal of semiconductor device 1-i. This prevents supply of electric charges to semiconductor device 1-i from the other semiconductor devices connected in parallel to semiconductor device 1-i. As a result, the electric charge only from DC power supply 3 is supplied to semiconductor device 1-i, and the voltage across the current detection unit 4 is varied. Measuring instrument 5 is configured of real-time measuring instrument, such as an oscilloscope, and constantly monitors the voltage across the current detection unit 4. This allows the electric charge only from DC power supply 3 to be supplied to semiconductor device 1-i on which cosmic rays is incident, eliminating the effects of the other semiconductor devices connected in parallel to semiconductor device 1-i.

Embodiment 9

Figure 13:
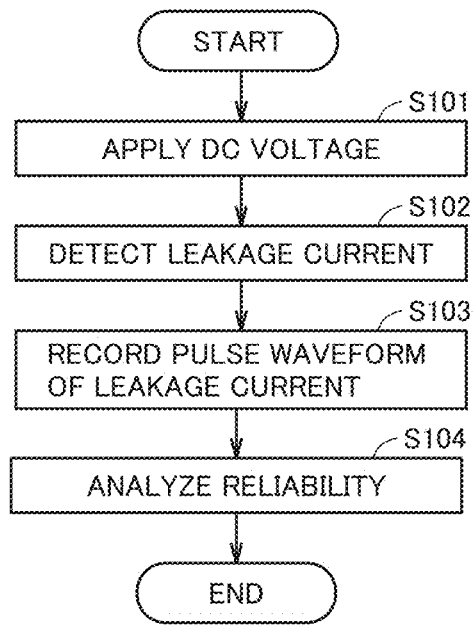
FIG. 13 is a flowchart representing process steps of a semiconductor device reliability evaluation method according to Embodiment 9.

FIG. 13 is a flowchart representing process steps of a semiconductor device reliability evaluation method according to Embodiment 9.

In step S101, a DC power supply 3 applies DC voltage to test semiconductor devices 1-1 through 1-N.

In step S102, a current detection unit 4 detects the leakage current of a test circuit 2 in which test semiconductor devices 1-1 through 1-N are included.

In step S103, measuring instrument 5 records a pulse waveform of the leakage current.

In step S104, an analyzer 6 analyzes the reliability of test semiconductor devices 1-1 through 1-N included in test circuit 2, based on the recorded pulse waveform.

Embodiment 10

Figure 14:
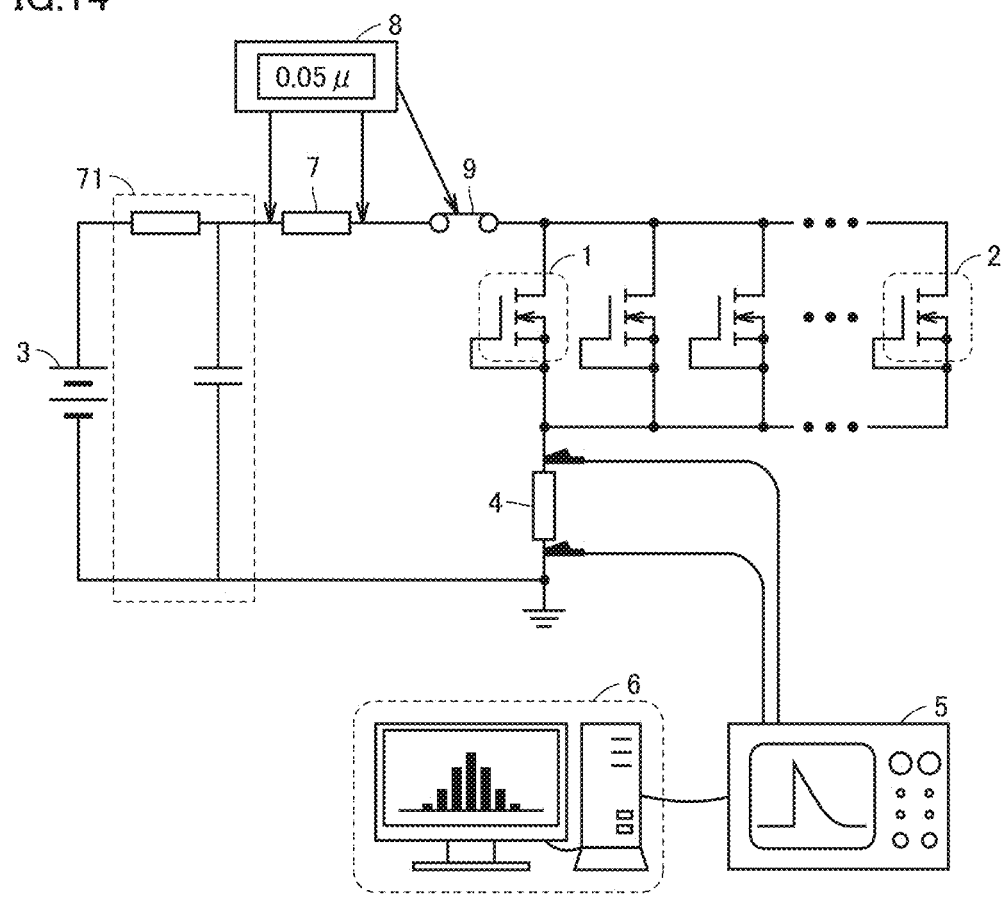
FIG. 14 is a block diagram of a semiconductor device reliability evaluation apparatus according to Embodiment 10.

FIG. 14 is a block diagram of a semiconductor device reliability evaluation apparatus according to Embodiment 10.

The reliability evaluation apparatus according to Embodiment 10 includes a filter circuit 71, in addition to the components of reliability evaluation apparatus 10 according to Embodiment 1 of FIG. 1.

Filter circuit 71 is disposed between a DC power supply 3 and a protection resistor 7.

Filter circuit 71 is, for example, a low-pass filter having a cut-off frequency of about a few Hertz. Filter circuit 71 reduces high-frequency noise that is generated in DC power supply 3.

Since noise can be reduced from DC power supply 3 by filter circuit 71, variations can be inhibited from occurring in current detection unit 4. As a result, the current that is induced by cosmic rays can be detected with higher accuracy.

Embodiment 11

A specific hardware configuration of an analyzer 6 included in a reliability evaluation apparatus 10 is described.

Figure 15:
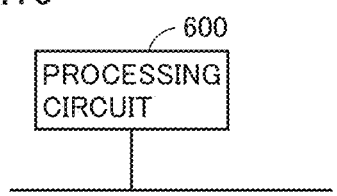
FIG. 15 is a diagram representing one example hardware configuration of an analyzer 6 included in reliability evaluation apparatus 10.

FIG. 15 is a diagram representing one example hardware configuration of analyzer 6 according to reliability evaluation apparatus 10.

Analyzer 6 included in reliability evaluation apparatus 10 of FIG. 1 is configured of a processing circuit 600. Processing circuit 600 can be, for example, a single circuit, a complex circuit, a programmed processor, ASIC (Application Specific Integrated Circuit), an FPGA (Field Programmable Gate Array), or a combination thereof.

Figure 16:
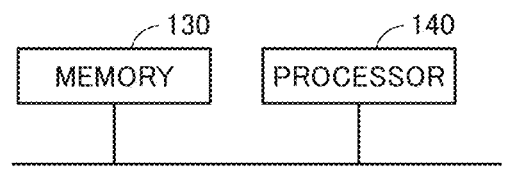
FIG. 16 is a diagram representing another example hardware configuration of analyzer 6 included in reliability evaluation apparatus 10.

FIG. 16 is a diagram representing another example hardware configuration of analyzer 6 included in reliability evaluation apparatus 10.

Analyzer 6 included in reliability evaluation apparatus 10 of FIG. 1 is implemented by software, firmware, or a combination of software and firmware. Software and firmware are written as programs and stored in a memory 130. Memory 130 is configured of, for example, a non-volatile or volatile semiconductor memory, such as a ROM (Read Only Memory), a RAM (Random Access Memory), a flash memory, an EPROM (Erasable Programmable Read Only), an EEPROM (Electrically Erasable Programmable Read-Only Memory), a magnetic disc, a flexible disc, an optical disc, a compact disc, a minidisc, or a DVD (Digital Versatile Disc). A processor 140 implements the functionality of analyzer 6 by executing a program stored in memory 130. The program is also said to be causing a computer to execute the process steps and the method of analyzer 6.

Note that some of the functionality of analyzer 6 may be implemented in dedicated hardware, while some others may be implemented in software or firmware.

The presently disclosed embodiment should be considered in all aspects as illustrative and not restrictive. The scope of the present disclosure is indicated by the appended claims, rather than by the description above, and all changes that come within the scope of the claims and the meaning and range of equivalency of the claims are intended to be embraced within their scope.

REFERENCE SIGNS LIST 1-1 through 1-N, 1A-1 through 1A-NA, 1B-1 through 1B-NB semiconductor device; 2, 2A, 2B test circuit; 3 DC power supply; 4, 60 current detection unit; 4A, 4B current detector; 5 measuring instrument; 6 analyzer; 7 protection resistor; 8 voltmeter; 9 relay switch; 10, 110, 210, 310, 410 semiconductor device reliability evaluation apparatus; 20, 120, 220, 320A, 320B, 420 closed circuit; 22 capacitor for electric charge supply; 23 limiting resistor; 24 integrator; 24a operational amplifier; 24b capacitor; 24c resistor; 30-1 through 30-N diode; 71 filter circuit; 600 processing circuit; 130 memory; 140 processor; 250 rectifier circuit.

The invention claimed is:

1. A semiconductor device reliability evaluation apparatus, comprising:
a direct-current (DC) power supply to apply a DC voltage to at least one test semiconductor device;
a current detection circuit to detect a leakage current of a test circuit in which the at least one test semiconductor device is included;
a measuring instrument to start recording a waveform pulse-shaped temporal change in the leakage current at a moment a value of the leakage current is greater than or equal to a threshold value of the leakage current due to incidence of radiation derived by cosmic ray; and
an analyzer to analyze failure probability of the at least one test semiconductor device included in the test circuit, based on the recorded pulse-shaped temporal waveform.

2. The semiconductor device reliability evaluation apparatus according to claim 1, wherein
the at least one test semiconductor device comprises a plurality of test semiconductor devices,
the DC power supply applies the DC voltage to the plurality of test semiconductor devices connected in parallel; and
the current detection circuit detects a sum of leakage currents of the plurality of test semiconductor devices.

3. The semiconductor device reliability evaluation apparatus according to claim 1, comprising:
a diode connected in forward direction from the DC power supply to a test semiconductor device included in the at least one test semiconductor device.

4. The semiconductor device reliability evaluation apparatus according to claim 1, wherein
the current detection circuit includes an inductance component.

5. The semiconductor device reliability evaluation apparatus according to claim 1, wherein
the current detection circuit includes a capacitor for electric charge supply, a limiting resistor, and an integrator.

6. The semiconductor device reliability evaluation apparatus according to claim 2, wherein
a product of the DC voltage and a total of capacities of the plurality of test semiconductor devices connected to the current detection circuit is less than a threshold electric charge of an electric charge, generated by radiation, which is required to destroy a test semiconductor device included in the plurality of test semiconductor devices.

7. The semiconductor device reliability evaluation apparatus according to claim 1, wherein
the current detection circuit includes:
a first current detector to detect a leakage current of a first test circuit which includes a first one of the at least one test semiconductor device or a first plurality of the at least one test semiconductor devices connected in parallel; and
a second current detector to detect a leakage current of a second test circuit which includes a second one of the at least one test semiconductor device or a second plurality of the at least one test semiconductor devices connected in parallel,
the measuring instrument records a first waveform of pulse-shaped temporal change in the leakage current detected by the first current detector and a second waveform of pulse-shaped temporal change in the leakage current detected by the second current detector, and
the analyzer:
analyzes failure probability of the first one or more test semiconductor devices included in the first test circuit based on the recorded first pulse-shaped temporal change waveform; and
analyzes failure probability of the second one or more test semiconductor devices included in the second test circuit based on the recorded second pulse-shaped temporal change waveform.

8. The semiconductor device reliability evaluation apparatus according to claim 1, wherein
the analyzer analyzes the failure probability of the at least one test semiconductor device included in the test circuit based on a magnitude of the pulse-shaped temporal change waveform.

9. The semiconductor device reliability evaluation apparatus according to claim 1, wherein
the analyzer analyzes the failure probability of the at least one test semiconductor device included in the test circuit based on a duration of the pulse-shaped temporal change waveform.

10. The semiconductor device reliability evaluation apparatus according to claim 1, wherein
the analyzer analyzes the failure probability of the at least one test semiconductor device included in the test circuit based on an incidence of the pulse-shaped temporal change waveform.

11. The semiconductor device reliability evaluation apparatus according to claim 1, wherein
the analyzer analyzes the failure probability of the at least one test semiconductor device included in the test circuit based on an incidence of the pulse-shaped temporal change waveform and an electric charge which is calculated by a product of a magnitude of the pulse-shaped temporal change waveform and a duration of the pulse-shaped temporal change waveform.

12. The semiconductor device reliability evaluation apparatus according to claim 1, wherein
the analyzer evaluates the failure probability of the at least one test semiconductor device included in the test circuit based on temporal characteristics of the recorded multiple pulse-shaped temporal change waveforms and temporal characteristics of multiple pulse-shaped temporal change waveforms of a reference semiconductor device.

13. The semiconductor device reliability evaluation apparatus according to claim 1, comprising:
a filter circuit disposed between the DC power supply and the semiconductor device.

14. A semiconductor device reliability evaluation method, comprising:
applying a direct-current (DC) voltage to at least one test semiconductor device:
detecting a leakage current of a test circuit in which the at least one test semiconductor device is included;
starting recording a pulse-shaped temporal change waveform of the leakage current at a moment a value of the leakage current is greater than or equal to a threshold value of the leakage current due to incidence of radiation derived by cosmic ray; and
analyzing failure probability of the at least one test semiconductor device included in the test circuit based on the recorded pulse-shaped temporal change waveform.

* * * * *